United States Patent [19]

Baumberger et al.

[11] Patent Number: 5,297,967
[45] Date of Patent: Mar. 29, 1994

[54] ELECTRICAL INTERCONNECTOR WITH HELICAL CONTACTING PORTION AND ASSEMBLY USING SAME

[75] Inventors: John G. Baumberger, Johnson City; Fraser P. Donlan, Jr.; James R. Petrozello, both of Endicott, all of N.Y.

[73] Assignee: International Business Machines Corporation, Armonk, N.Y.

[21] Appl. No.: 959,839

[22] Filed: Oct. 13, 1992

[51] Int. Cl.⁵ .............................................. H01R 9/09
[52] U.S. Cl. ...................................... 439/66; 439/886; 439/887
[58] Field of Search .......................... 439/66, 886, 887

[56] References Cited

U.S. PATENT DOCUMENTS

| | | | |
|---|---|---|---|
| 3,634,807 | 1/1972 | Grobe et al. | 439/66 |
| 4,027,935 | 6/1977 | Byrnes et al. | |
| 4,620,761 | 11/1986 | Smith et al. | 439/66 |
| 4,705,205 | 11/1987 | Allen et al. | |
| 4,793,814 | 12/1988 | Zifcak et al. | |
| 4,927,369 | 5/1990 | Grabbe et al. | |
| 5,017,738 | 5/1991 | Tsuji et al. | 439/886 |
| 5,030,109 | 7/1991 | Dery | |
| 5,037,311 | 8/1991 | Frankeny et al. | |
| 5,061,191 | 10/1991 | Casciotti et al. | |
| 5,137,461 | 8/1992 | Bindra et al. | 439/74 |

FOREIGN PATENT DOCUMENTS

| | | | |
|---|---|---|---|
| 2639154 | 5/1990 | France | 439/66 |
| 92/08258 | 5/1992 | World Int. Prop. O. | 439/66 |

OTHER PUBLICATIONS

IBM Technical Disclosure Bulletin, vol. 22, No. 1, Jun. 1979, E. D. Barkhuff.
"AMP Designer Digest 56", Copyright 1991, pp. 10-12.

*Primary Examiner*—Mark Rosenbaum
*Assistant Examiner*—David P. Bryant
*Attorney, Agent, or Firm*—Lawrence R. Fraley

[57] ABSTRACT

An electrical interconnector for interconnecting two circuit members wherein the interconnector comprises a dielectric member and at least one conductive element. The conductive element includes a base portion retained within the dielectric and at least one projecting helical portion for engaging a conductor of one of the circuit members. Preferably, dendritic elements (e.g., palladium) are formed on the terminal ends of the helical portions for providing debris removal. The form of connection between the helical portion and the conductor is of the non-wiping type. An electrical assembly including this interconnector is also described.

35 Claims, 6 Drawing Sheets

ELECTRICAL INTERCONNECTOR WITH HELICAL CONTACTING PORTION AND ASSEMBLY USING SAME

TECHNICAL FIELD

The invention relates to electrical interconnectors and particularly to such connectors of the high density array type wherein several connections are simultaneously provided between respective pairs of conductors located on or within respective pairs of electrical circuit members, e.g., printed circuit boards, modules, etc.

CROSS REFERENCE TO CO-PENDING APPLICATION

In Ser. No. (S.N.) 07/847,970, filed Mar. 05, 1992, and entitled "Spring Array Connector" (inventors: G. F. Walker et al), there is defined a spring array connector which includes a resilient spring core, an electrically insulating layer disposed parallel to the core, electrically conducting segments disposed at locations on the insulating layer and a plurality of electrical contacts electrically connected to the conducting segments. Each of the multiple springs of the array is independently bendable, with embodiments including those of sine, helix, cantilever and buckling beam shapes in both sheet and wire form.

BACKGROUND OF THE INVENTION

As defined herein, the present invention is particularly adaptable for use in the information handling systems (computer) field wherein high density connections have become the norm. In such use, the formed interconnections must satisfy high standards of reliability. Further, to assure effective repair and/or replacement, e.g., for upgrade purposes, it is also often desired that such connections be separable and reconnectable in the field within the final product. Such separability is also desirable during assembly of the various products which will utilize these connectors to facilitate testing thereof. Still further, the final structures for such interconnectors should be tolerant of dust and other debris which may accumulate during the life of the connection. When interconnecting two circuit members, such as between a printed circuit board and a module, there also exists the possibility of nonplanarity of the surfaces of the conductors (and the structures including such conductors), which nonplanarity must be compensated for in order to assure effective and reliable connections between such members.

One known method for providing various interconnections is referred to as a wire bond technique, which involves the mechanical and thermal compression of a soft metal wire, e.g., gold, from one circuit to another. Such bonding, however, does not lend itself readily to high density connections because of possible wire breakage and accompanying mechanical difficulty in wire handling. Another technique involves strategic placement of solder balls or the like between respective circuit elements, e.g., pads, and reflowing the solder to effect interconnection. While this technique has proven extremely successful in providing high density interconnections for various structures, this technique does not allow facile separation and subsequent reconnection. In yet another technique, an elastomer has been used which included therein a plurality of conductive paths, e.g., small diameter wires or columns of conductive material, to provide the necessary interconnections. Known techiques using such elastomeric materials typically possess the following deficiencies: (1) high forces are usually required per contact; (2) relatively high electrical resistance through the interconnection between the associated circuit elements, e.g., pads; (3) sensitivity to dust, debris and other environmental elements which could adversely affect a sound connection; and (4) limited density, e.g., due to physical limitations of particular connector designs.

Attention is directed to U.S. Pat. Nos. 3,173,732, 3,960,424, 4,161,346, 4,655,519, 4,295,700, 4,664,458, 4,688,864 and 4,971,565 for various techniques for providing electrical interconnections for a variety of electrical circuit members. As understood from a reading of these patents, the techniques described therein include many of the aforedefined disadvantages, e.g., potential misalignment, low density, etc. as well as others, e.g., relatively complex design, costly to manufacture, etc.

It is believed that a high density electrical interconnector capable of providing effective, reliable connections wherein such connections are repeatable (such that connection and reconnection can readily occur), and which provides the other advantageous features discernable from the following description, would constitute a significant advancement in the art.

DISCLOSURE OF THE INVENTION

It is, therefore, a primary object of the present invention to enhance the electrical interconnector art.

It is yet another object of the invention to provide an electrical interconnector capable of providing high density interconnections of a highly reliable and improved nature, which connections can be readily separated and repeated, if desired.

It is yet another object of the invention to provide such an interconnector which is relatively inexpensive to manufacture and also of relatively simple design.

It is a still further object of the invention to provide an electrical assembly which utilizes the interconnector defined herein.

In accordance with one aspect of the invention, there is defined an interconnector for electrically interconnecting an electrical conductor on one circuit member to an electrical conductor on a second circuit member, the interconnector including a dielectric member adapted for being positioned between both circuit members and at least one electrically conductive element. The electrically conductive element includes a relatively flat base portion located upon or within the dielectric member and a helical portion which extends away from the flat base portion and the dielectric member. This helical portion is adapted for engaging one of the electrical conductors of one of the circuit members.

In accordance with the second aspect of the invention, there is provided an electrical assembly including first and second circuit members and an interconnector for electrically interconnecting conductors on said members. The interconnector includes the features cited immediately above.

In accordance with a third aspect Of the invention, there is provided an information handling system including the aforementioned electrical assembly.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 6:
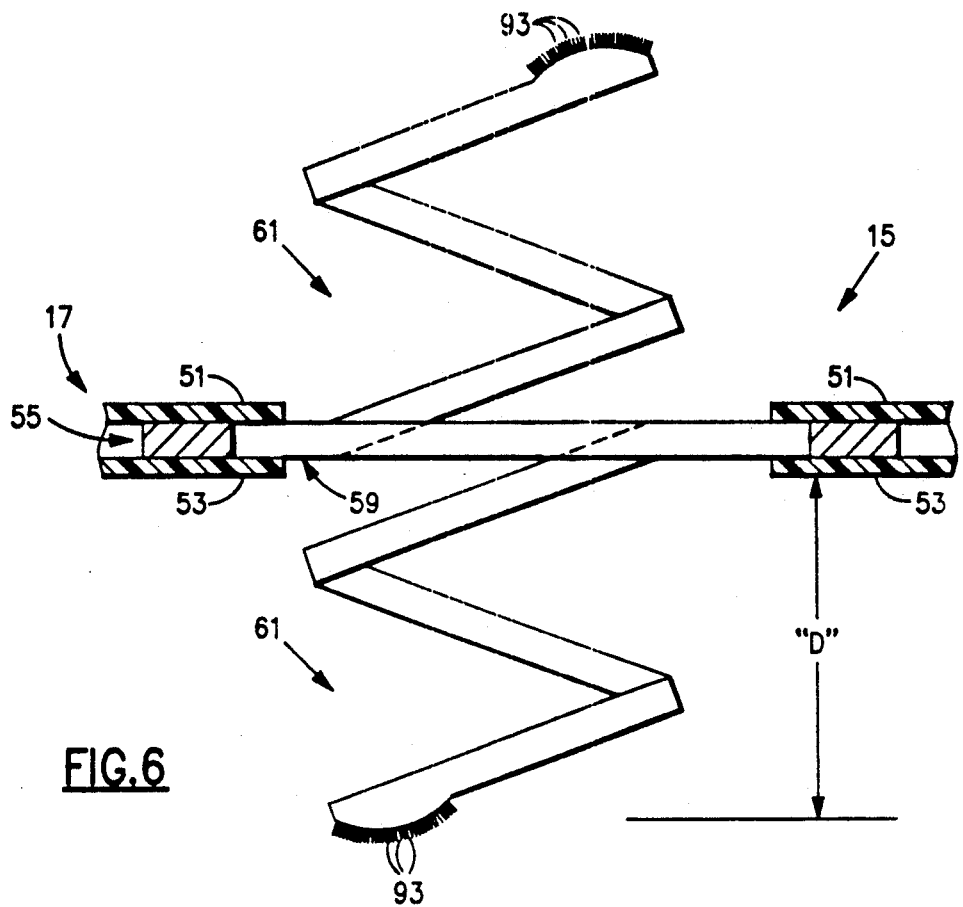
FIG. 6 is a partial side view, in section and on a much enlarged scale over the view in FIG. 5, illustrating an interconnector in accordance with one embodiment of the invention.

In FIG. 6, there is shown an electrical interconnector 15 in accordance with a preferred embodiment of the invention. Interconnector 15, as defined herein, is specifically designed for electrically interconnecting first and second electrical circuit members to provide high density interconnections between such circuit members, as is strongly desired in the computer industry. Examples of suitable circuit members for being interconnected by the present invention include printed circuit boards, electronic circuit modules, etc. Use of such boards, modules, etc. within a computer, e.g., as part of a processor cage structure, is well known in the art. By the term printed circuit board as used herein is meant to include a multilayered circuit structure including therein one or more conductive (e.g., signal, power and/or ground) layers. Such printed circuit boards, also occasionally referred to in the art as printed wiring boards, are well known in the art and further description is not believed necessary. By the term circuit module as used herein is meant to include a substrate or the like member having various electrical components (e.g., semiconductor chips, conductive circuitry, conductive pins, etc.) which may form a part thereof. Examples of such modules are mentioned in U.S. Pat. Nos. 4,688,151 and 4,912,772, and also illustrated in FIG. 7 (described below). Further description of such modules is thus not believed necessary.

Interconnector 15, as defined herein, possesses several advantageous features. Particularly, the invention is able to provide uniform contacting force against the respective conductors of the circuit members which it engages. The invention is also adaptable to high speed electrical structures due to its ability to assure minimum inductance, as well as minimum capacitance between adjacent conductive elements (should a large array of such elements be used). Accordingly, the interconnector of the present invention assures minimal signal degradation, as is considered essential in many computer systems. Further, the interconnector of the present invention is capable of being produced at relatively low cost and can be operated in a relatively simple manner. Still further, the interconnector as defined herein is capable of readily overcoming non-planarity between adjacent circuit members and/or the conductors thereon to thus assure effective connection between such members under all operating conditions. As also defined, one particular embodiment of the invention provides effective coupling to the respective conductors by removing debris or other matter which might impair such connections.

Figure 7:
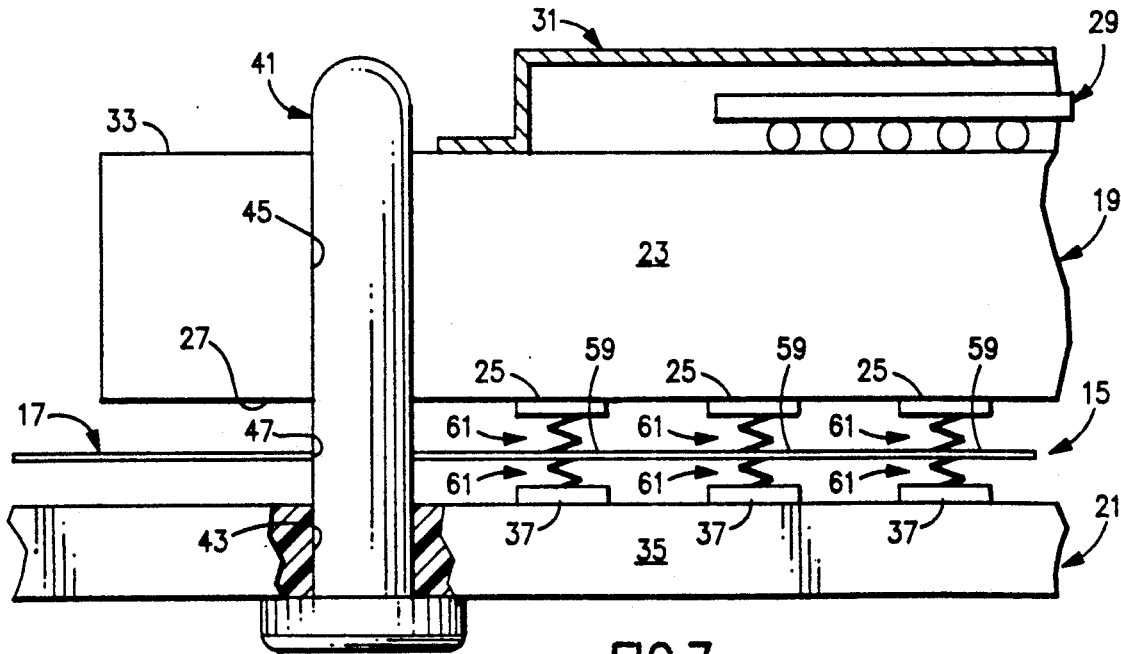
FIG. 7 is a partial side view illustrating an interconnector of the invention positioned between a pair of electrical circuit members for providing electrical connection between respective pairs of electrical conductors thereof.

As shown in FIG. 6, interconnector 15 includes a dielectric member 17 adapted for being positioned between first and second electrical circuit members 19 and 21 (FIG. 7). In FIG. 7, member 19 is illustrated as a module and thus includes a substrate 23 with a plurality of conductors 25 along a bottom surface 27 thereof. Each conductor is preferably a metallic (e.g., copper) pad of relatively flat construction but may assume other configurations as are known in the art. It is desirable to overplate conductors (25) with nickel and gold to prevent corrosion and also provide a highly reliable connection for the present invention. Circuit member 19 may also include a plurality of semiconductor chips 29 (only one shown in FIG. 7), which in turn are electrically coupled to pads 25 through internal circuitry (not shown) within substrate 23. An additional cover 31 or the like may be provided on the substrate's upper surface 33. A typical substrate material for circuit member 19 is ceramic, but others are of course acceptable.

In FIG. 7, the lower circuit member 21 is shown as a printed circuit board and also includes a substrate portion 35, which may be comprised of known material (e.g., epoxy resin reinforced with fiberglass) and, as stated above, may include pluralities of conductive planes (e.g., signal, power or ground) internally thereof. Located on an upper surface of the circuit board are a plurality of electrical conductors 37, which in turn are electrically coupled to the various internal planes through any acceptable means (e.g., conductive vias or plated-through-holes) and further description is not believed necessary. Conductors 37 are similar (e.g., copper) to conductors 25 and also preferably include nickel and gold overplate for the reasons stated above.

In comparing FIGS. 6 and 7, dielectric member 17 is positioned substantially between both circuit members 19 and 21 in a predetermined manner of alignment. Such alignment may be accomplished using a plurality of alignment pins 41 (only one shown in FIG. 7), each pin fitting within respective apertures 43 and 45 located within circuit members 21 and 19, respectively. Alignment with dielectric member 17 is accomplished by providing an opening 47 within the dielectric and passing one of the pins 41 therethrough. In a preferred embodiment of the invention, a total of two pins 41 are utilized, each at respective opposite corners of the overall rectangular shaped structure. This is not meant to limit the invention, however, in that additional numbers of such pins may be utilized.

In FIG. 6, dielectric member 17 is shown to include upper and lower layers 51 and 53. Each layer is preferably comprised of a polymer material, a preferred such material being polyimide, this material laminated onto the outer surfaces of an interim electrically conductive element 55 which represents the electrically conducting portion of interconnector 15. Each polyimide layer 51 and 53 preferably possesses a thickness of from about 0.001 inch to about 0.003 inch. Although only one such conductive element is shown in FIG. 6, it is understood that several such elements may be utilized in the invention, depending on the operational requirements for the final assembly which will utilize the present invention. In one example, a total of 625 such elements 55 may be used.

Conductive element 55 includes a relatively flat base portion 59 which, as shown in FIG. 6, is located substantially between the outer, surrounding layers 51 and 53. Alternatively, it is within the scope of the invention that this conductive, relatively flat base portion 59 be located externally of a singular dielectric layer, also preferably of polyimide, to thus present only a dual layered structure for this portion of the invention. Additionally, conductive element 55 includes at least one resilient helical portion 61 which extends in a direction away from the flat base portion 59. In the embodiment of FIG. 6, two helical portions are shown, each extending in opposite directions (up and down) from the interim, relatively flat base portion 55. Each helical portion, as understood, is designed for engaging a respective electrical conductor 25 or 37. In the embodiment of FIG. 6, the upwardly projecting helical portion 61 is designed for engaging a conductor 25 on member 19, while the lower projecting helical portion 61 is designed for engaging a conductor 37 on the lower circuit member 21. Thus, interconnector 15 provides an electrical connection between a first conductor 25 and an associated second conductor 37.

Figure 9:
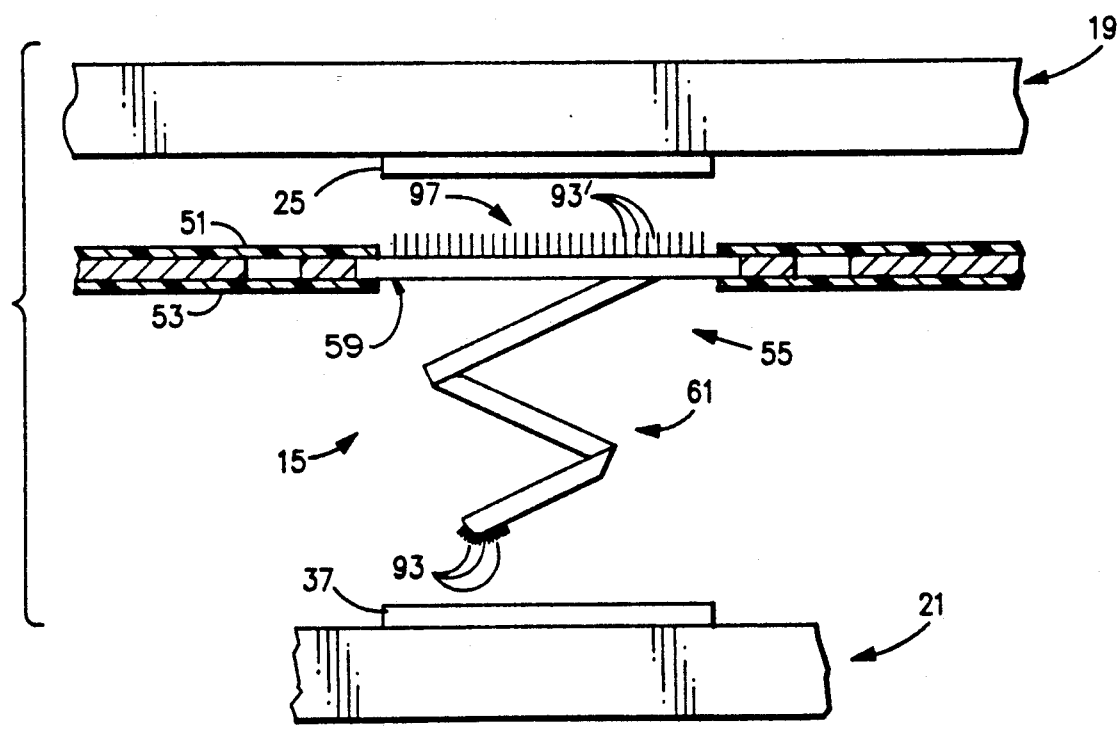
Figure 11:
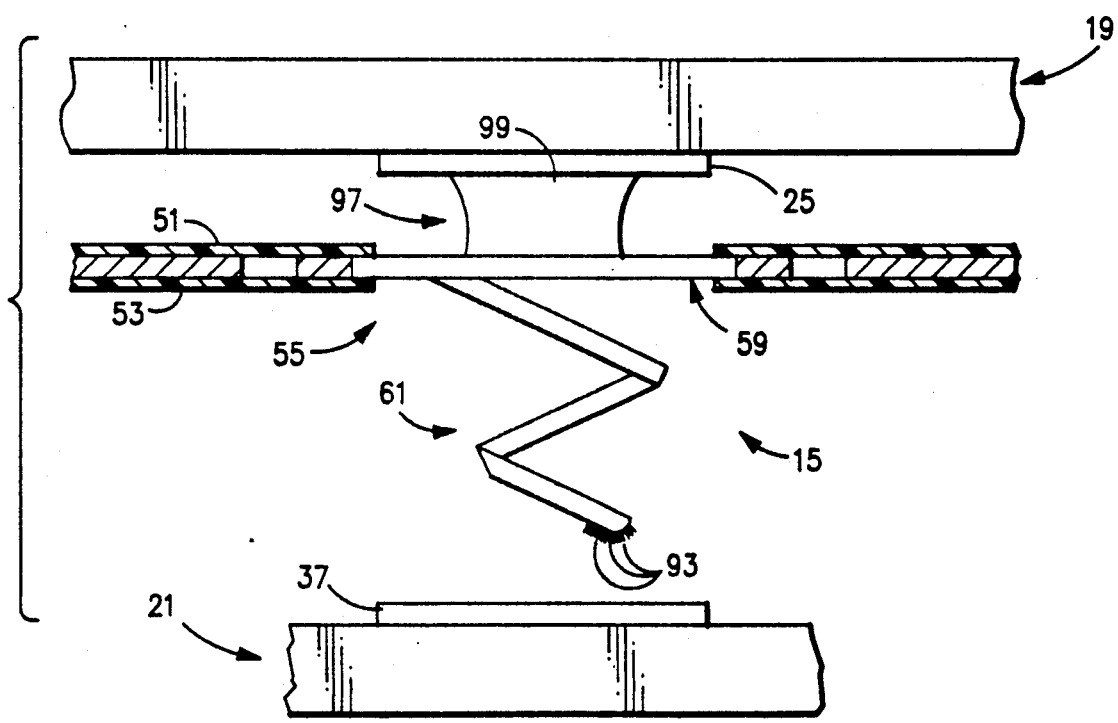

Although two opposing helical portions 61 are shown in the embodiment in FIG. 6, it is understood that alternative embodiments are well within the scope of the invention. For example, it is possible, as defined herein, to utilize but a singular helical portion and provide alternative means for coupling to the other conductor. Such an embodiment is depicted in FIGS. 9 and 11 and will be described in further detail hereinbelow. Significantly, it is also possible to provide two helical portions on one side of the interconnector, to thus assure redundancy of connection. Such a feature is considered particularly significant and desirable.

Figure 1:
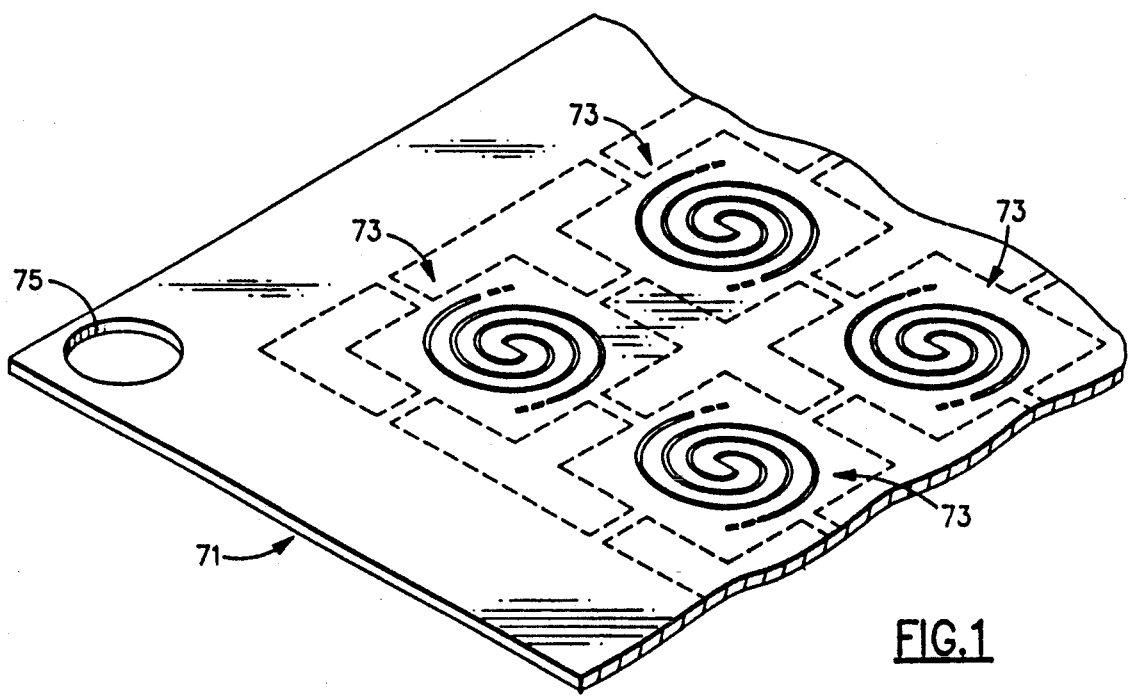
FIGS. 1-5 illustrate the various steps for producing an interconnector in accordance with a preferred embodiment of the invention.

In FIGS. 1-5, there are shown the various steps of producing interconnector 15 in accordance with a preferred embodiment of the invention. In FIG. 1, a singular sheet 71 of flat conductive material is provided preferred conductive material for this sheet, which sheet will eventually form the conductive element of the invention, is beryllium copper. Other metallic materials are acceptable, including phosporbronze. In one example, a sheet 71 having a thickness of about 0.005 inch was used, with side dimensions of about 1.5 inch by about 1.5 inch. A total of 625 conductive elements may be formed in a sheet of this size, indicating the extremely high density capabilities of the invention.

A grouping of predetermined-shaped curvilinear elements 73 and rectangular "pads" 77 (each associated with one element) are formed in FIG. 1, preferably using an etching procedure or the like. Such a procedure may be of one known in the art and further description is not believed necessary. Each of these formed, curved elements is understood to eventually comprise the expanded helical portions of the respective conductive elements 55 of the invention as shown in FIG. 6. Additionally, an opening 75 is also preferably provided as shown, such opening to eventually be adapted for receiving one of the alignment pins 41 (FIG. 7). The pattern necessary to enable etching of the curvilinear elements and pads shown in FIG. 1 is preferably provided using known photolithography steps as may be used in many printed circuit board manufacturing operations. Accordingly, further description is not believed necessary.

Figure 2:
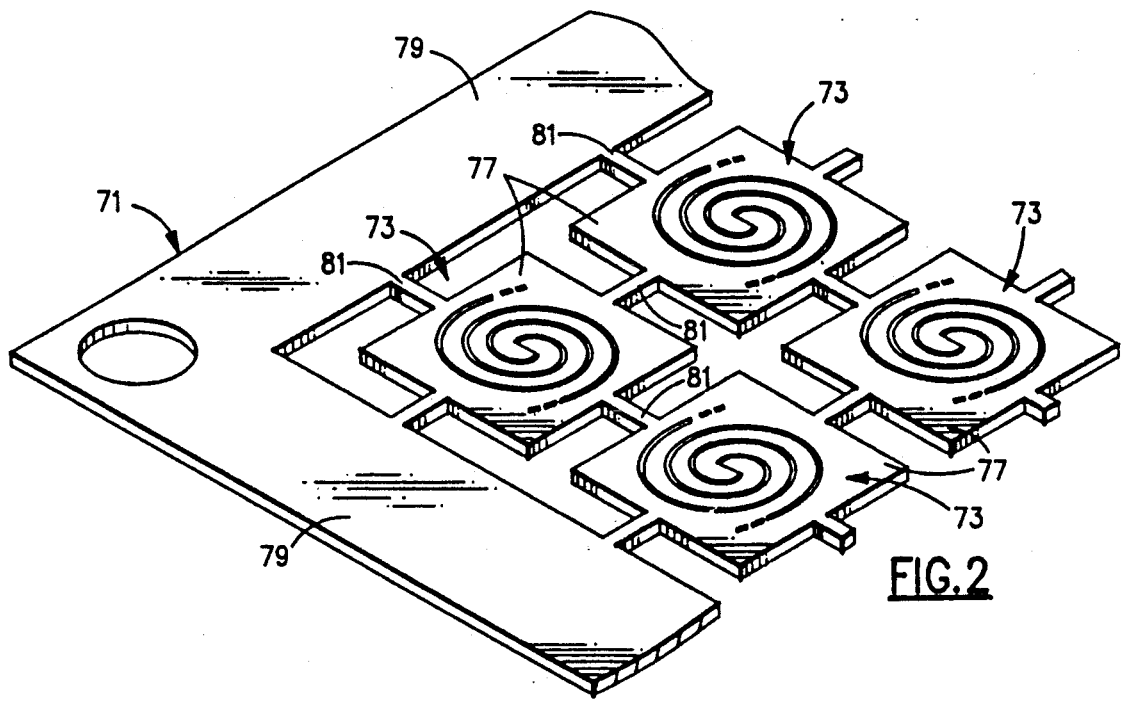

FIG. 2 shows the curved elements 73 and pads 77 formed. Each of the helical elements 73 remains formed within a substantially rectangular pad 77, each pad 77 connected to an adjacent such pad or to the surrounding boundary (peripheral) portion 79 of sheet 71 through a connecting tab 81. Each pad 71 is thus connected on each of its four sides by one of these tabs. In one example of the invention, each tab may possess a width of only about 0.005 to 0.010 inch. Although etching has been defined as the preferred means for material removal from sheet 71, alternative means are within the scope of the invention, including laser ablation and stamping.

Figure 3:
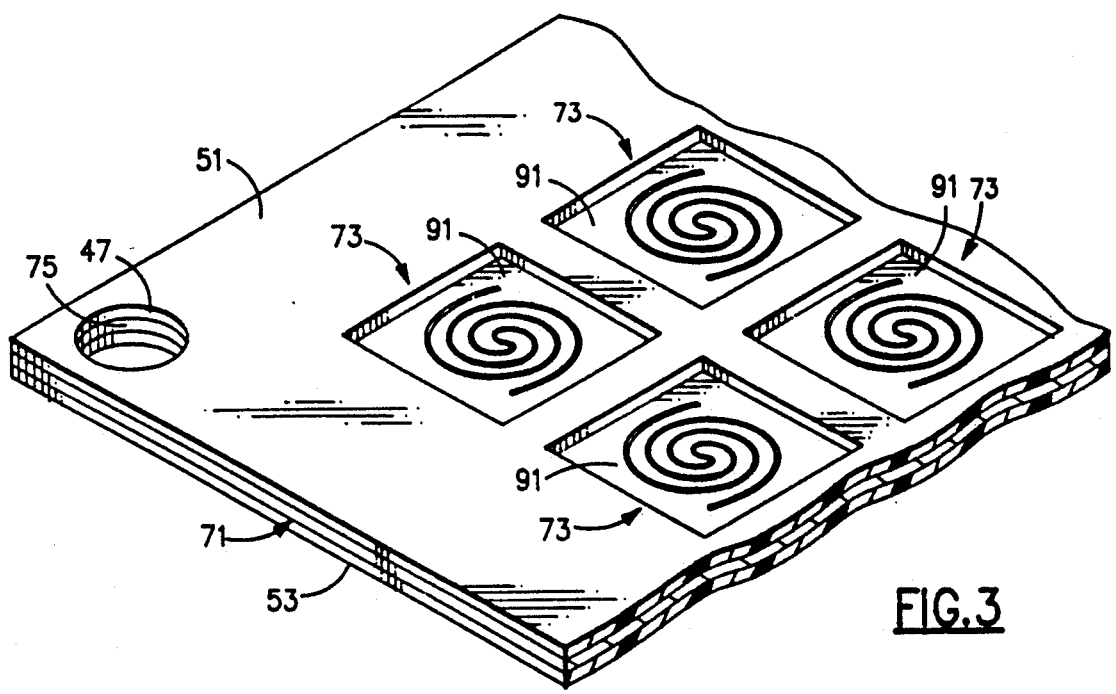

As shown in FIG. 3, sheet 71, of the same configuration as in FIG. 2, is now substantially covered on opposite surfaces thereof with a layer of dielectric material 51 and 53 (described above). Preferably, this dielectric is applied using lamination techniques, several of which are known in the art, and further description is not believed necessary. Significantly, a window 91 is provided within each layer relative to one of the elements 73. This window, preferably rectangular, is slightly less than the corresponding width of the rectangular pad sections 77. This slight overlap can be seen in the cross-sectional view of FIG. 6. Each layer 51 and 53 is of the thickness described above in FIG. 6. Each window 91 is preferably square and possesses side dimensions each of about 0.035 inch, in comparison to the respective side dimensions for its pad 77, which dimensions are preferably slightly larger at 0.045 inch square. The overall thickness for this structure of FIG. 3, including that of the two dielectric layers and interim metallic sheet 71, is thus about 0.010 inch. Significantly, the dielectric is also provided with the aforementioned opening 47 therein which, as shown, aligns with the respective opening 75 in sheet 71.

Figure 4:
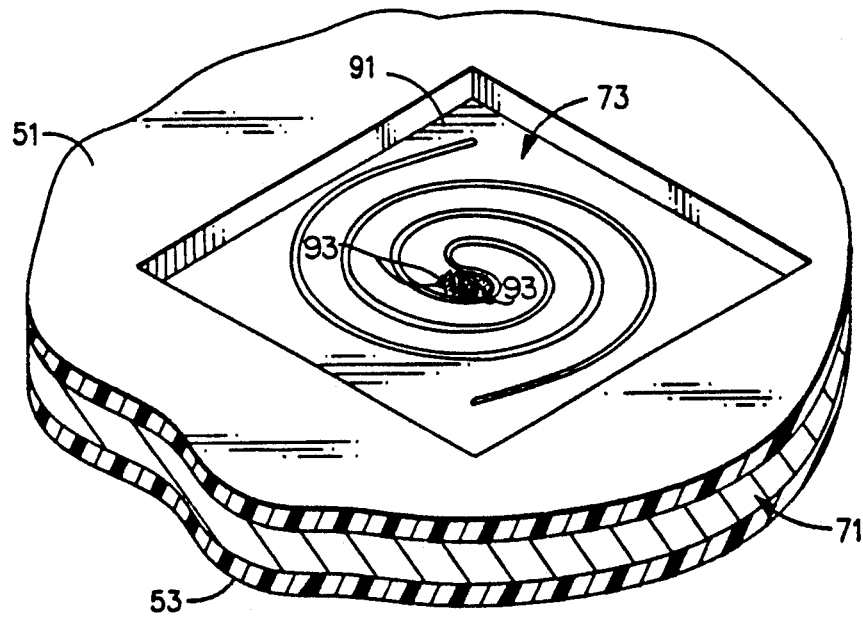

In accordance with a preferred embodiment of the invention, the next step in the manufacture of the invention involves the provision of a plurality of dendritic elements 93 on the curved, terminal ends of the curvilinear segments 73. In the embodiment of FIG. 4, these elements 93 are shown only on one of these curved ends and project upwardly in this perspective view. Should this particular segment eventually form a dual, opposed projecting conductive element as shown in FIG. 6, the underside of the other, adjacent curved terminal end would be similarly provided with such dendritic elements. Dendritic formation is preferably accomplished in accordance with the techniques defined in Canadian Patent 1,121,011, the disclosure of which is incorporated herein by reference. This is not meant to limit the invention, however, in that other techniques for applying such elements may be utilized. Preferably, and as described in this patent, these elements may be comprised of a conductive material selected from the group consisting essentially of palladium, platinum, rhodium, ruthenium, osmium, iridium and tungsten. Such elements are grown on the metallic (beryllium copper) substrate and may be done so in the presence of the surrounding polyimide dielectric material which forms layers 51 and 53 without adversely affecting such layers. Use of dendritic elements constitutes an important aspect of the invention for the several advantages described for these elements mentioned in the aforementioned patent. For example, such elements are especially effective in debris removal from respective surfaces to which these engage. As described above, the conductive element of the invention is capable of engaging flat surfaces (e.g., copper pads) and also may engage conductors having dendritic or similar elements of the type described herein. In either case, the dendritic elements 93 provide sound, effective connection. Of further significance, such connection is in a non-wiping form of engagement, due to the shape of the helical part of the invention's conductive element and its compressibility when engaged. As defined in the textbook "Principles of Electronic Packaging" by D. P. Seraphim, R. C. Lasky and C. Y. Li(1989), at page 207, wipe is defined as the relative translation under load of two contact surfaces. A non-wiping form of connection is thus understood to be one wherein such translational movement does not occur. Dendritic elements 93 are also shown in the embodiments of FIGS. 8-11. In one example of the invention, a total of approximately 1000 dendritic elements 93 may be formed on each curved terminal end.

Figure 5:
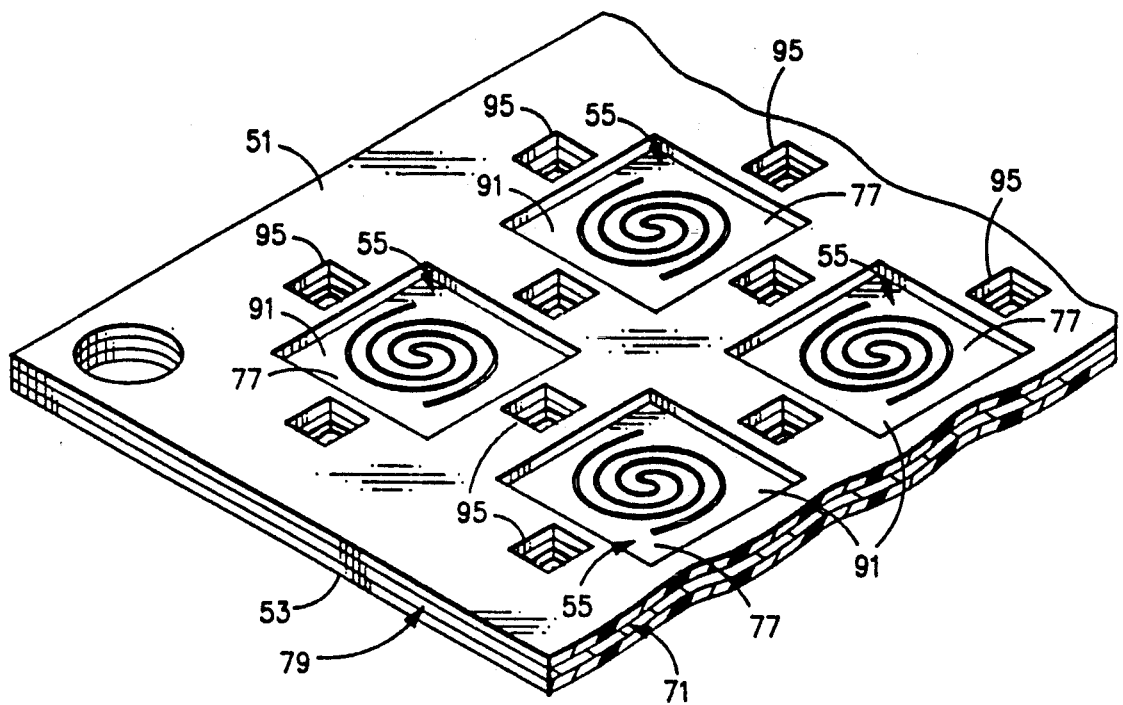

In FIG. 5, each of the substantially rectangular shaped segments 77 is electrically isolated from adjacent segments and also from the boundary (peripheral) portions 79 of the interim sheet 71. This is preferably accomplished by punching or laser ablation wherein apertures 95 are formed within the composite structure. Each aperture, understandably, extends through the entire thickness of this composite structure. Significantly, this punching or similar removal operation causes a separation of the connecting tabs 81 to thereby isolate the previously formed pad sections so as to form the now finally identified conductive elements 55 of the configuration depicted in the cross-sectional view in FIG. 6 prior to helical extension.

In the next step of the invention, the helical portions of the invention are extended outwardly a predetermined distance. Such extension is preferably accomplished by a die forming operation, whereby each helical portion is formed to the desired dimensions. In a preferred embodiment, each helical portion extends a distance (dimension "D") of about 0.020 inch from the respective outer surface of the adjacent dielectric layer. This is not meant to limit the invention, however, in that other extensions may be provided, depending on the corresponding dimensional constraints of the structure receiving the invention.

It was determined that an interconnector of the thicknesses and dimensions described above possessed a contacting force from each helical portion of about a minimum of 50 grams.

Prior to formation of the defined dendritic elements 93, it is also preferred to plate the beryllium copper outer surfaces with a layer of nickel and thereafter provide an extremely thin coating of precious metal (e.g., gold), the nickel serving as a diffusion barrier. The defined dendritic elements are then formed (e.g., grown) on this metallic substrate. In one example of the invention, a nickel layer having a thickness of about 60-80 microinches and a gold layer having a thickness of about 50-100 microinches was formed. These additional plating steps preferably occur prior to lamination of the polyimide dielectric layers, but may also occur subsequent thereto and thus only within the defined windows 91, thereby representing a savings in material and cost.

In FIGS. 8-11, there are shown alternate embodiments of the invention.

Figure 8:
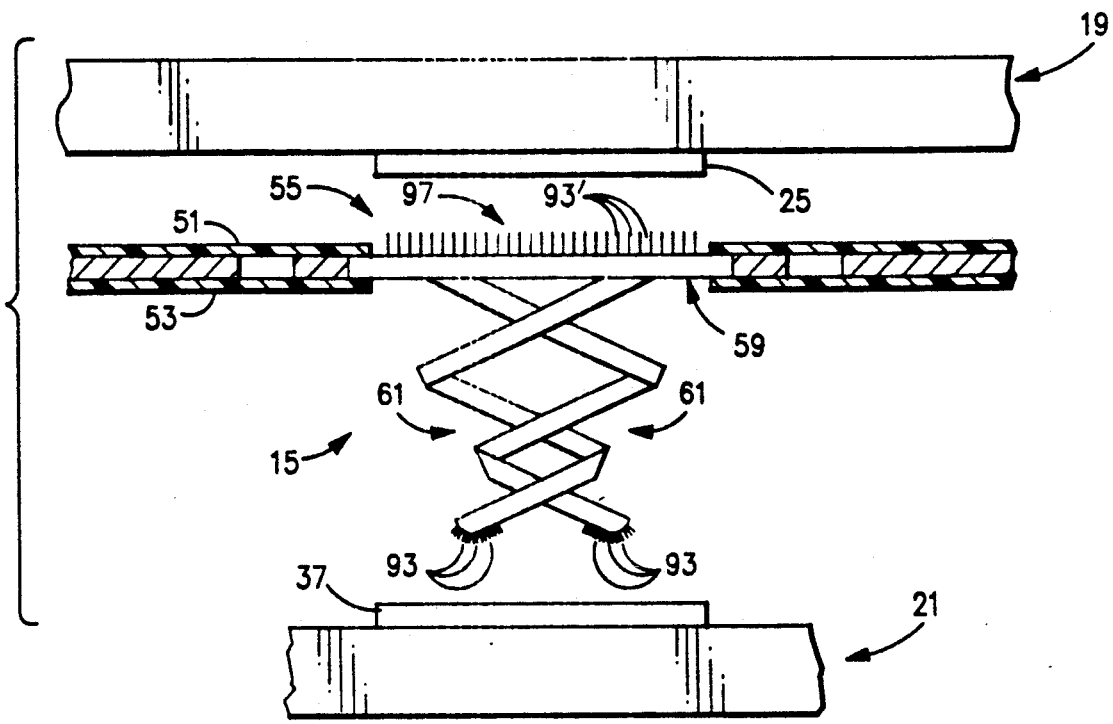
FIGS. 8-11 represent partial side views, in section and on a much enlarged scale over the view of FIG. 7, illustrating various alternative embodiments of an interconnector of the invention.

In FIG. 8, interconnector 15 includes dual helical portions 61 but each of these portions are extended from the conductive element's base portion 59 in a singular, common direction (downward in FIG. 8). This is accomplished by merely depressing both helical portions shown, for example, in the embodiment of FIG. 5, downwardly. The advantage of this structure is that it assures redundancy of connection with the respective conductor 37 to which it engages. Each terminal end of these helical portions includes, preferably, the described dendritic elements 93. As also shown in FIG. 8, there is provided means 97 for providing electrical connection between base portion 59 and the remaining conductor 25. In the embodiment of FIG. 8, this means is preferably a plurality of dendritic elements 93' formed on the opposite surface of the base portion 59 in accordance with similar teachings for the formation of elements 93. Such dendritic formation may occur simultaneously with the formation of elements 93. Dendritic elements 93' engage conductor 25 during compression of interconnector 15, as caused by bringing together circuit members 19 and 21. Such compression of the circuit members may be accomplished using various means in the art (e.g., external clamping structures), and further description is not believed necessary.

In FIG. 9, interconnector 15 includes but a singular helical portion 61 projecting downwardly with the other formed helical portion remaining coplanar with base portion 59. This additional surface area enables the provision of additional dendritic elements 93', which dendritic elements 93' form the means of electrical connection to conductor 25.

It is understood in FIGS. 8 and 9 that connection with the respective conductors 25 and 37 has not yet occurred. This is for illustration purposes to better enable the viewer to see the various parts of the invention prior to such engagement. During engagement, it is understood that the helical portions of the invention are compressed a predetermined distance and effective connections are made. In one example of the invention, each of the invention's helical portions may be compressed a distance of about 0.020 inch from its overall initial height (dimension "D") in FIG. 6.

Figure 10:
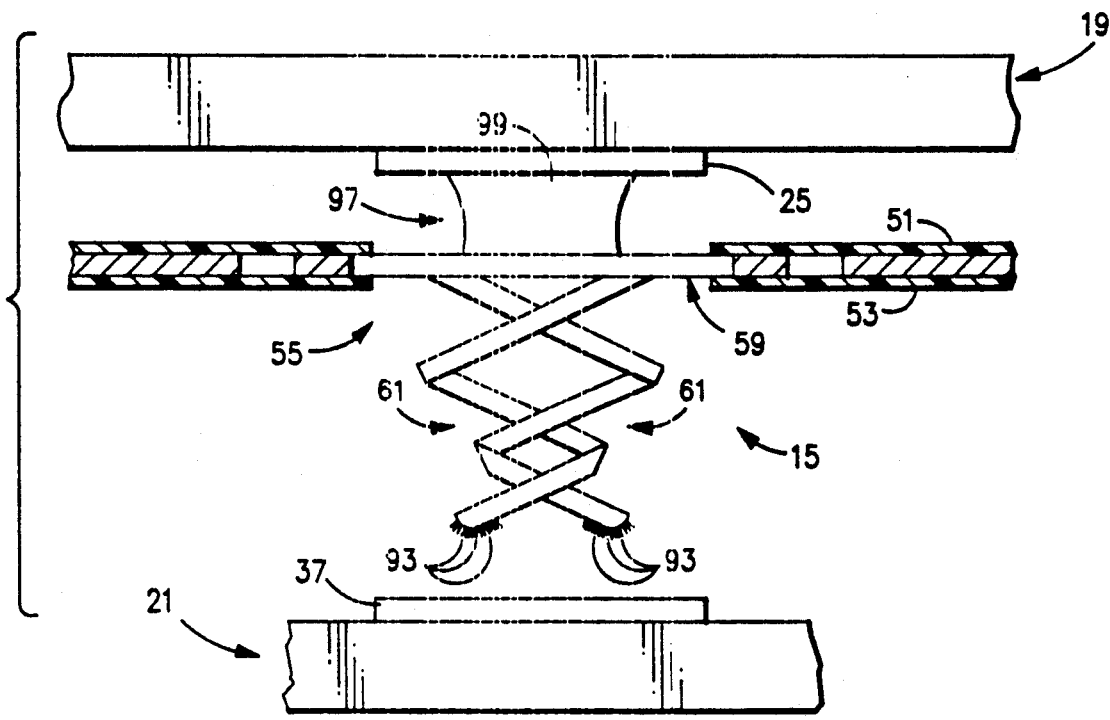

In FIG. 10, interconnector 15 includes the dual helical portions 61 of similar configuration to those in FIG. 8. To provide electrical coupling between the interconnector's base portion 59 and adjacent conductor 25, means 97 preferably comprises a quantity of solder 99. In a preferred embodiment of the invention, solder 99 was 63:37 tin:lead, wherein the tin comprised about 63% of the solder composition with the lead comprising the remaining 37%. Alternative solders are of course acceptable, including 90:10 tin:lead, wherein the tin comprises about 90% with the remaining 10% comprised of lead. This provides a fixed type of connection between the conductive element of the invention and one of the respective conductors being coupled.

In FIG. 11, the embodiment of the invention as depicted therein is similar to that of FIG. 9, with the exception that solder material 99, preferably similar to that in the embodiment of FIG. 10, is utilized to form the relatively fixed connection between conductor 25 and conductive element 55. Use of a singular helical portion, as in the embodiment of FIG. 9, allows for greater surface area for receiving the preferred solder.

Thus there has been shown and described an electrical interconnector for interconnecting a pair of circuit members wherein the interconnector is designed for being positioned between the two circuit members. Significantly, the invention is able to accommodate for non-planarity of the respective circuit members and/or the conductors thereon while assuring effective coupling therebetween. The invention as defined is relatively simple to produce and relatively easy to operate. Although the invention has been described as a means for providing electrical connection between respective pairs of conductors, it is also possible to utilize the metallic conductor for heat transference (e.g., from module to board) should this be desired. Accordingly, it is possible to utilize a plurality of such heat transferring members in combination with the interconnecting structure defined herein to the assure both thermal and electrical paths at designated locations within a combined structure.

While there have been shown and described what are at present considered the preferred embodiments of the invention, it will be obvious to those skilled in the art that various changes and modifications may be made therein without departing from the scope of the invention as defined by the appended claims.

What is claimed is:

1. An interconnector for electrically interconnecting a plurality of electrical conductors on a first electrical circuit member to a plurality of electrical conductors on a second electrical circuit member, said interconnector comprising:
   a dielectric member adapted for being positioned between said first and second electrical circuit members; and
   a plurality of electrical conductive elements formed from a single sheet of material, each element including
   a relatively flat base portion located within or upon said dielectric member in a substantially planar orientation with the others of said base portions,
   a first resilient helical portion extending in a direction away from said flat base portion and said dielectric member and adapted for engaging a respective one of said electrical conductors on said first of said electrical circuit members in a non-wiping form of engagement, and
   means located on said flat base portion for electrically contacting a respective one of said electrical conductors on said second of said electrical circuit members, 2. The interconnector of claim 1 further including a plurality of dendritic elements located on each of said first helical, portions, said dendritic elements engaging said respective electrical conductors of said first electrical circuit member.

3. The interconnector of claim 2 wherein said dendritic elements are comprised of a material selected from the group consisting of palladium, platinum, rhodium, ruthenium, osmium, iridium and tungsten.

4. The interconnector of claim 1 wherein said dielectric member is comprised of polyimide.

5. The interconnector of claim 1 wherein said electrical conductive elements are each comprised of beryllium copper.

6. The interconnector of claim 1 wherein said base portions of said electrical conductive elements are positioned within said dielectric member in said substantially planar orientation, said dielectric member including first and second layers thereof, said layers located on opposing sides of said base portions.

7. The interconnector of claim 4 wherein said means located on each of said relatively flat base portions comprises a plurality of dendritic elements.

8. The interconnector of claim 7 wherein said dendritic elements are comprised of a material selected from the group consisting of palladium, platinum, rhodium, ruthenium, osmium, iridium and tungsten.

9. The interconnector of claim 1 wherein said means located on each of said relatively flat base portions comprises a quantity of solder.

10. The interconnector of claim 1 wherein said means located on each of said flat base portions comprises a second resilient helical portion, said second resilient helical portion extending from said base portion in a direction substantially opposite said first helical portion and adapted for engaging a respective one of said electrical conductors of said second of said electrical circuit members.

11. The interconnector of claim 10 wherein said second resilient helical portions of said conductive elements each include a plurality of dendritic elements thereon for engaging said respective conductor of said second electrical circuit member.

12. The interconnector of claim 11 wherein said dendritic elements are comprised of a material selected from the group consisting of palladium, platinum, rhodium, ruthenium, osmium, iridium and tungsten.

13. The interconnector of claim 1 wherein each of said electrically conductive elements further includes a second resilient helical portion, each of said second resilient helical portions extending from said base portion in the same direction as said first helical portion to thereby provide means for redundant engagement with said respective conductor of said first electrical circuit member.

14. The interconnector of claim 5 wherein said means located on each of said base portions for electrically contacting a respective one of said electrical conductors of said second circuit member comprises a plurality of dendritic elements.

15. The interconnector of claim 14 wherein said dendritic elements are comprised of a material selected from the group consisting of palladium, platinum, rhodium, ruthenium, osmium, iridium and tungsten.

16. The interconnector of claim 13 wherein each of said means for electrical contacting a respective one of said electrical conductors of said second of said electrical circuit members comprises a quantity of solder.

17. An electrical assembly including:
   a first electrical circuit member including a plurality of electrical conductors;
   a second electrical circuit member including a plurality of electrical conductors; and
   an interconnector for electrically interconnecting said electrical conductors on said first circuit member to said electrical conductors on said second electrical circuit member, said interconnector including a dielectric member positioned between said first and second electrical circuit members and a plurality of electrical conductive elements formed from a single sheet of material, each element including
   a relatively flat base portion located within or upon said dielectric member in a substantially planar orientation with the others of said base portions,
   a first resilient helical portion extending in a direction away from said flat base portion and said dielectric member and engaging a respective one of said electrical conductors on said first electrical circuit member in a non-wiping form of engagement, and means located on said flat base portion and electrically contacting a respective one of said electrical conductors on said second of said electrical circuit members.

18. The assembly of claim 17 further including a plurality of dendritic elements located on each of said first helical portions, said dendritic elements engaging each said respective electrical conductor of said first electrical circuit member.

19. The assembly of claim 18 wherein said dendritic elements are comprised of a material selected from the group consisting of palladium, platinum, rhodium, ruthenium, osmium, iridium and tunsten.

20. The assembly of claim 17 wherein said dielectric member is comprised of polyimide.

21. The assembly of claim 17 wherein said electrical conductive elements are each comprised of beryllium copper.

22. The assembly of claim 17 wherein said base portions of said electrical conductive elements are positioned within said dielectric member in said substantially planar orientation, said dielectric member including first and second layers thereof, said layers located on opposing sides of said base portions.

23. The assembly of claim 17 wherein said means located on each of said relatively flat base portions comprises a plurality of dendritic elements.

24. The assembly of claim 23 wherein said dendritic elements are comprised of a material selected from the group consisting of palladium, platinum, rhodium, ruthenium, osmium, iridium and tungsten.

25. The assembly of claim 17 wherein each of said means located on said relatively flat base portions comprises a quantity of solder.

26. The assembly of claim 17 wherein said means located on each of said flat base portions comprises a second resilient helical portion, said second resilient helical portion extending from said base portion in a direction substantially opposite said first helical portion and engaging a respective one of said electrical conductors of said second of said electrical circuit members.

27. The assembly of claim 26 wherein said second resilient helical portions of said conductive elements each include a plurality of dendritic elements thereon for engaging said respective conductor of said second electrical circuit member.

28. The assembly of claim 27 wherein said dendritic elements are comprised of a material selected from the group consisting of palladium, platinum, rhodium, ruthenium, osmium, iridium and tunsten.

29. The assembly of claim 17 wherein each of said electrically conductive elements further includes a second resilient helical portion, each of said second resilient helical portions extending from said base portion in the same direction as said first helical portion and engaging with said respective conductor of said first electrical circuit member.

30. The assembly of claim 29 wherein said means located on each of said base portions and electrically contacting a respective one of said electrical conductors of said second circuit member comprises a plurality of dendritic elements.

31. The assembly of claim 30 wherein said dendritic elements are comprised of a material selected from the group consisting of palladium, platinum, rhodium, ruthenium, osmium, iridium and tunsten.

32. The assembly of claim 29 wherein each of said means electrically contacting a respective one of said electrical conductors of said second of said electrical circuit members comprises a quantity of solder.

33. The assembly of claim 17 wherein said first electrical circuit member comprises an electronic module.

34. The assembly of claim 17 wherein said second electrical circuit member comprises a printed circuit board.

35. An information handling system comprising:
an electrical assembly including a first electrical circuit member including a plurality of electrical conductors and a second electrical circuit member including a plurality of electrical conductors; and
an interconnector for electrically interconnecting said plurality of electrical conductors on said first circuit member to said plurality of said electrical conductors on said second electrical circuit member, said interconnector including a dielectric member positioned between said first and second electrical circuit members and a plurality of electrical conductive elements formed from a single sheet of material, each element including
a relatively flat base portion located within or upon said dielectric member in a substantially planar orientation with the others of said base portions,
a first resilient helical portion extending in a direction away from said flat base portion and said dielectric member and engaging a respective one of said electrical conductors on said first of said electrical circuit members in a non-wiping form of engagement, and
means located on said flat base portion and electrically contacting a respective one of said electrical conductors on said second of said electrical circuit members.

* * * * *

UNITED STATES PATENT AND TRADEMARK OFFICE
CERTIFICATE OF CORRECTION

PATENT NO. : 5,297,967
DATED : March 29, 1994
INVENTOR(S) : John G. Baumberger et al.

It is certified that error appears in the above-identified patent and that said Letters Patent is hereby corrected as shown below:

Col. 9, line 48 (claim 1)  - delete "members," and add --members.--.

Col. 9, line 51 (claim 2)  - after "elements engaging", add --each--.

Col. 9, line 52 (claim 2)  - after "said respective electrical", delete "conductors" and add --conductor--.

Col. 10, line 1 (claim 7)  - after "interconnector of claim", delete "4" and add --1--.

Col. 10, line 36 (claim 14) - after "interconnector of claim", delete "5" and add --13--.

Signed and Sealed this

First Day of November, 1994

Attest:

BRUCE LEHMAN

*Attesting Officer*  *Commissioner of Patents and Trademarks*